United States Patent [19]
Kelem et al.

[11] Patent Number: 5,909,453
[45] Date of Patent: Jun. 1, 1999

[54] LOOKAHEAD STRUCTURE FOR FAST SCAN TESTING

[75] Inventors: Steven H. Kelem, Los Altos Hills; Charles R. Erickson, Fremont, both of Calif.

[73] Assignee: Xilinx, Inc., San Jose, Calif.

[21] Appl. No.: 08/887,357

[22] Filed: Jul. 2, 1997

[51] Int. Cl.[6] .................................................. G01R 31/28
[52] U.S. Cl. ...................................... 371/22.32; 365/201
[58] Field of Search .............................. 371/22.32, 22.31, 371/22.35, 22.5, 27.5, 27.7, 22.34, 22.36, 21.1; 395/183.06, 183.19, 183.13, 183.18, 183.2; 324/73.1, 76.11, 765; 364/489; 327/334; 365/201

[56] References Cited

U.S. PATENT DOCUMENTS

| | | | |
|---|---|---|---|
| 5,302,866 | 4/1994 | Chiang et al. | 307/465 |
| 5,425,034 | 6/1995 | Ozaki | 371/22.3 |
| 5,477,545 | 12/1995 | Huang | 371/22.3 |
| 5,504,756 | 4/1996 | Kim et al. | 371/22.3 |
| 5,528,169 | 6/1996 | New | 326/40 |
| 5,550,843 | 8/1996 | Yee | 371/22.3 |
| 5,646,422 | 7/1997 | Hashizume | 257/48 |
| 5,675,589 | 10/1997 | Yee | 371/22.3 |
| 5,710,779 | 1/1998 | Whetsel | 371/22.3 |
| 5,726,999 | 3/1998 | Bradford et al. | 371/22.32 |

OTHER PUBLICATIONS

"IEEE Standard Test Access Port and Boundary–Scan Architecture" IEEE Std 1149.1–1990, Copyright 1993, Published by the Institute of Electrical and Electronics Engineers, Inc. 345 East 47th Street, New York, NY 10017.

*Primary Examiner*—Robert W. Beausoliel, Jr.
*Assistant Examiner*—Nadeem Iqbal
*Attorney, Agent, or Firm*—Crosby, Heafey, Roach & May; Jeanette S. Harms

[57] ABSTRACT

A scan lookahead skip structure that allows a programmable number of test bits, I/O blocks, flip-flops, or columns to be skipped. One embodiment of the structure includes multiplexers to skip the scan paths for several adjacent I/O blocks, flip-flops, or columns, thereby reducing the number of clock cycles and overall delay required to utilize the scan path.

21 Claims, 17 Drawing Sheets

LOOKAHEAD STRUCTURE FOR FAST SCAN TESTING

FIELD OF THE INVENTION

The invention relates to scan testing of logic circuit networks and more particularly to a structure for accelerating scan testing.

BACKGROUND OF THE INVENTION

Two kinds of scan circuitry are used in integrated circuits—boundary scan and level-sensitive scan (LSSD). Boundary scan involves selectively isolating the I/O pads from the internal circuitry, applying stimulus to a shift register and applying those values to both the internal circuitry and the I/O pads, and then capturing the outputs from both the internal circuitry and the I/O pads. In this manner, boundary scan allows the I/O pads and on-chip logic circuitry to be tested independently. To facilitate this testing, the boundary scan circuitry is placed between the on-chip circuitry and the I/O pads.

IEEE Standard 1149.1-1990, "IEEE Standard Test Access Port and Boundary-Scan Architecture" (published by the Institute of Electrical and Electronics Engineers, Inc., 345 East 47th Street, New York, N.Y. 10017 USA) provides "standardized" approaches to: testing the interconnections between integrated circuits once they have been assembled onto a printed circuit board or other substrate; testing the integrated circuit itself, and observing or modifying circuit activity during the component's normal operation. This standard is well known in the art and therefore is not explained in detail herein.

Boundary scan circuitry details are dependent on the type of I/O pad in use. Each I/O pad can be characterized as being either an input pad, an output pad, a tri-statable output pad or a bidirectional I/O pad. To be able to control and observe the state on an I/O pad, at least one boundary scan bit is required for each of the above-listed I/O block types. Specifically, each input and output pad requires one boundary scan bit, each tri-statable output pad requires two boundary scan bits, and each bidirectional I/O pad requires three boundary scan bits. FIG. 1 shows the boundary scan for an input pad; FIG. 2 shows the boundary scan for an output pad; FIG. 3 shows the boundary scan for a tri-statable I/O pad; and FIG. 4 shows the boundary scan for a bidirectional I/O pad.

In the case of a tristatable I/O pad, one of the two scan bits is for the output signal, IOB.O, and the other bit is the alternate for the tristate enable signal, IOB.T. In the case of a bidirectional I/O pad, three bits are required because a bidirectional I/O pad is a combination of an input pad and a tri-statable I/O pad. One scan bit is therefore needed for the output signal, IOB.O, the second bit is the alternate for the tristate enable signal, IOB.T, and the third bit is for the input signal, IOB.I.

An alternative use for available boundary scan logic is to capture all of the user logic levels at the I/O pads into the shift register at the same time and then scan them out of the shift register serially. The capture of the data bits is performed by setting the Shift/Capture line to 0 before strobing the DRCK line, as can be seen in FIGS. 1–4.

FIG. 4 illustrates boundary scan circuitry in which all four types of I/O pads are co-resident. This commonly occurs in programmable logic devices in which the I/O pad type is determined not when the integrated circuit (IC) is fabricated, but when a designer programs the IC for a particular application. Because the I/O pad type needed by the designer is not known when the circuit is fabricated, all four types of I/O pads must be available so that the designer has full flexibility to use whatever type of I/O pad is needed for a particular application. Because all four types of I/O pads are available in each I/O pad on these integrated circuits, the scan chain must have three bits, even though perhaps not all of them will be used in every I/O pad. For example, an I/O pad that is used for input uses only the first data bit. An output pad uses only the second bit. A bidirectional I/O pad uses all three bits. An unused I/O pad uses none of the three bits, even though those bits remain in the scan chain. Thus, if all the I/O pads in a programmable logic device are connected in a scan chain, the number of data bits is always three times the number of I/O pads. This scan chain has the advantage of being the same length, no matter what the configuration of the I/O pad. But this scheme also has the disadvantage that the number of clocks required to scan all the data bits and the data storage required for these data bits is always three times the number of I/O pads, whether or not they are all used.

As indicated previously, two kinds of scan circuitry are used in integrated circuits—boundary scan and level-sensitive scan (LSSD). LSSD is a circuit testing technique which uses either a specially modified flip-flop in place of all flip-flops in a design, or places a special multiplexer in front of every flip-flop in a design. In this manner, the flip-flops in a chip's internal circuitry are converted into a shift register that includes all sequential elements in the circuit and isolates the combinational logic for testing and observation. FIG. 9 shows a circuit 900 before adding LSSD. In circuit 900, combinational logic block 901 drives flip-flops 902A–902C, and feedback lines provide the output signals of these flip-flops back to combinational logic block 901.

FIG. 10 shows how circuit 900 (FIG. 9) can be modified to incorporate LSSD. Specifically, multiplexers 1003A–1003C are added in front of flip-flops 902A–902C, respectively. The signal on Operate/Scan line 1004 determines whether flip-flops 902A–902C get their data from combinational logic block 901 or from scan chain 1005. If the signal on Operate/Scan line 1004 is a logic 1, combinational logic block 901 is connected to flip-flop input terminals, and circuit 1000 operates in the "operate" mode. On the other hand, if the signal on Operate/Scan line 1004 is a logic 0, flip-flops 902A–902C are connected in a scan chain. In this configuration, the data in the scan chain is shifted one position each clock cycle, from Scan_In to Scan_Out.

A first operating mode loads the flip-flop scan chain from off-chip. In this mode, the clock is cycled through enough cycles to load every flip-flop 902. Then the Operate/Scan signal is set to a logic 1. Combinational logic block 901 then operates on the data in flip-flops 902. A second operating mode off-loads the data from the scan chain to some destination outside of the chip. This mode begins in "operate" mode. When the signal on Operate/Scan line 1004 is set to logic 0 and circuit 1000 operates in "scan" mode, the data in flip-flops 902A–902C (obtained during the "operate" mode) can then be shifted up the scan chain toward Scan_Out.

An FPGA with built-in LSSD circuitry can implement the multiplexers as a dedicated resource and leave the combinational logic for implementation in configurable logic blocks (well known structures in programmable logic devices and therefore not explained in detail herein). In this implementation, if the end-user's programmed circuit doesn't use all of the flip-flops on the FPGA, the scan chain will still contain all of the "unused" flip-flops, thereby making the scan chain longer than is necessary and increasing the time required to scan the flip-flop data onto or off of the chip.

Therefore, a need arises for improving the testing of logic circuit networks, and specifically for accelerating the testing of both boundary and LSSD scan circuitry.

SUMMARY OF THE INVENTION

In accordance with the present invention, timing for both boundary scan testing as well as level-sensitive scan (LSSD) testing is improved. Specifically, the present invention includes a programmable skip structure that selectively allows a predetermined number of test bits, I/O blocks, flip-flops, or scan columns to be bypassed, thereby reducing the number of clock cycles and overall delay required to utilize the scan path, as desired by the user.

Boundary scan circuitry typically includes a plurality of sequential storage devices, such as flip-flops, and a plurality of selecting devices, such as multiplexers, wherein each selecting device provides a respective signal to a single flip-flop. A first selecting device receives an input scan signal. Subsequent selecting devices receive a signal from a previous flip-flop and an I/O signal. Examples of the I/O signals are input signals to the I/O block, output signals from the I/O block, and tristate enable signals.

The programmable skip structure of the present invention includes a chain of multiplexers. The first multiplexer in the chain receives the input scan signal and an output signal from a first storage device, and provides an output signal to a next selecting device and a next multiplexer in the chain. The next multiplexer in the chain also receives an input signal from a next storage device. In the present invention, each selecting device and associated storage device has a multiplexer for selectively skipping the bit in that storage device. In this manner, any bit provided by a storage device in the I/O block can be bypassed in the scan chain.

In one embodiment of the present invention, a programmable skip structure selectively bypasses one I/O block. This structure includes an additional chain of I/O multiplexers, one multiplexer per I/O block. The first I/O multiplexer in this chain receives an input scan signal and an output signal from a first I/O block. The next I/O multiplexer in the chain receives an output signal from the first I/O multiplexer and an output signal from the next I/O block. This configuration is repeated until the last I/O multiplexer which provides an output signal of the scan chain.

In another embodiment that permits multiple I/O blocks to be bypassed, the programmable skip structure of the present invention includes a multiplexer having a plurality of input terminals. The output terminal of the multiplexer is connected to an input terminal of a single I/O block, whereas the input terminals to the multiplexer are connected to a plurality of I/O block output terminals. In this manner, if the multiplexer includes n input terminals, up to n-1 I/O blocks can be programmably skipped.

A programmable skip structure of the present invention can also be used with an LSSD circuit. The LSSD circuit has a scan multiplexer for receiving a signal from a combinational logic block and for providing an output signal to a single flip-flop. The programmable skip structure includes a bypass multiplexer which provides an output signal to the scan multiplexer and receives input signals from a plurality of flip-flops. In this manner, if the bypass multiplexer includes n input terminals, then up to n-1 flip-flops can be programmably skipped.

The present invention is equally applicable in LSSD circuitry for selectively bypassing columns of a scan chain. The structure to accomplish this bypassing also includes a multiplexer, wherein one input terminal of the multiplexer is connected to the output line of a first column and another input terminal of the multiplexer is connected to one of an output line of a second column and an input line of the scan chain. The output terminal of the multiplexer is connected to one of an input line of a third column and an output line of the scan chain. The columns may be vertically-oriented, horizontally-oriented, or diagonally-oriented.

BRIEF DESCRIPTION OF THE DRAWINGS

The advantages of the present invention will be more fully understood as a result of the Detailed Description when taken in conjunction with the following drawings in which.

DETAILED DESCRIPTION OF THE DRAWINGS

The present invention comprises a boundary scan skip structure that allows a programmable number of adjacent I/O block flip-flops to be skipped. This structure can be programmed to skip the scan paths for a selected number of adjacent I/O blocks, and thereby reduce the overall clock cycle for the scan path. Several embodiments are disclosed herein.

Figure 1:
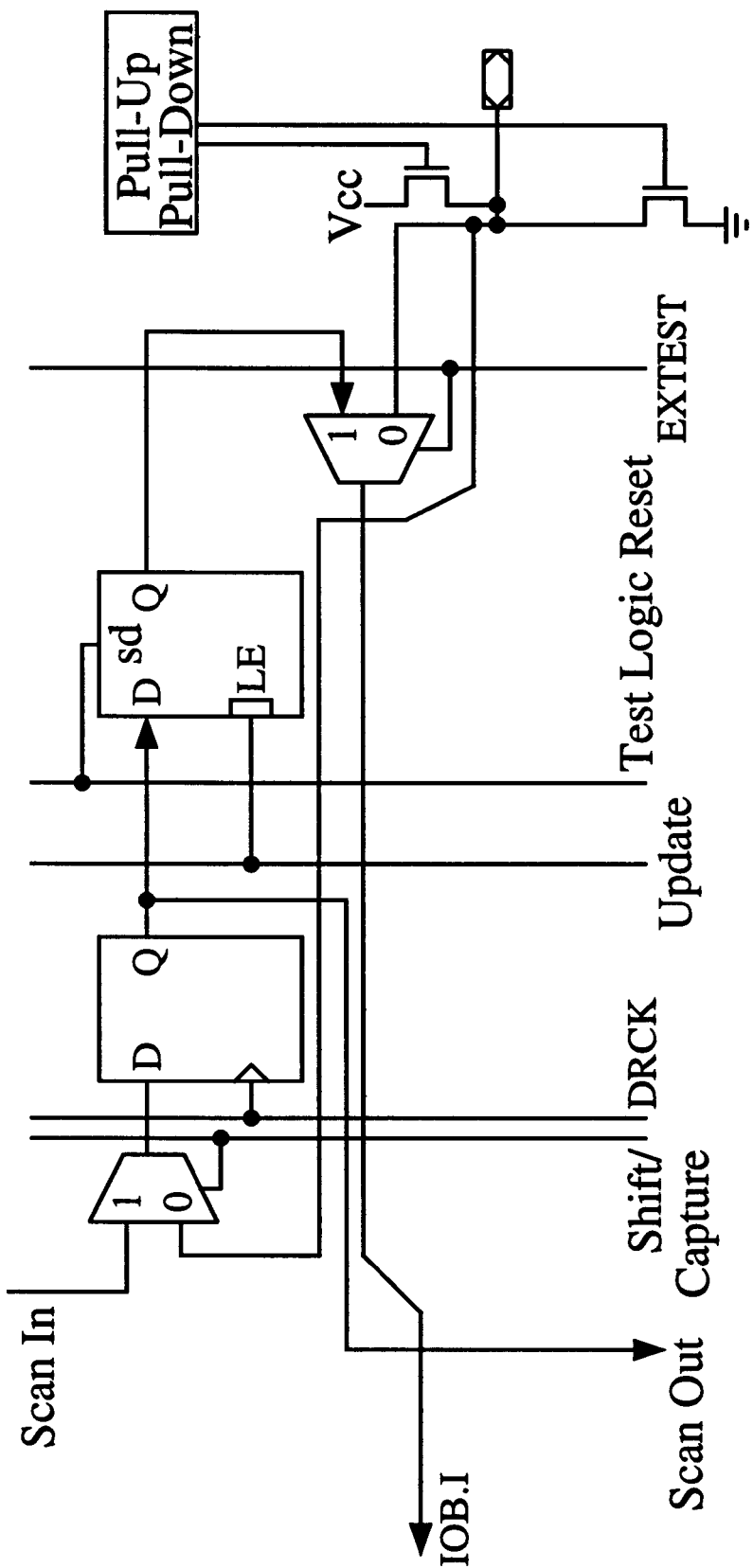
FIG. 1 illustrates a prior art boundary scan circuit for an input pad.
Figure 2:
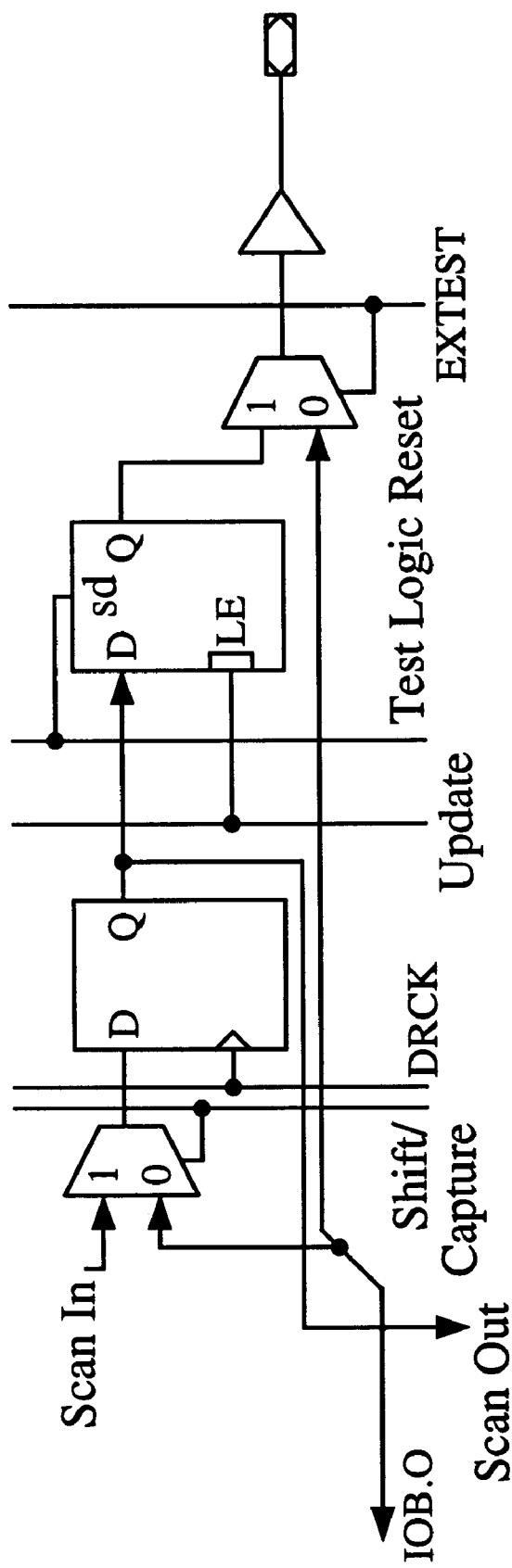
FIG. 2 shows a prior art boundary scan circuit for an output pad.
Figure 3:
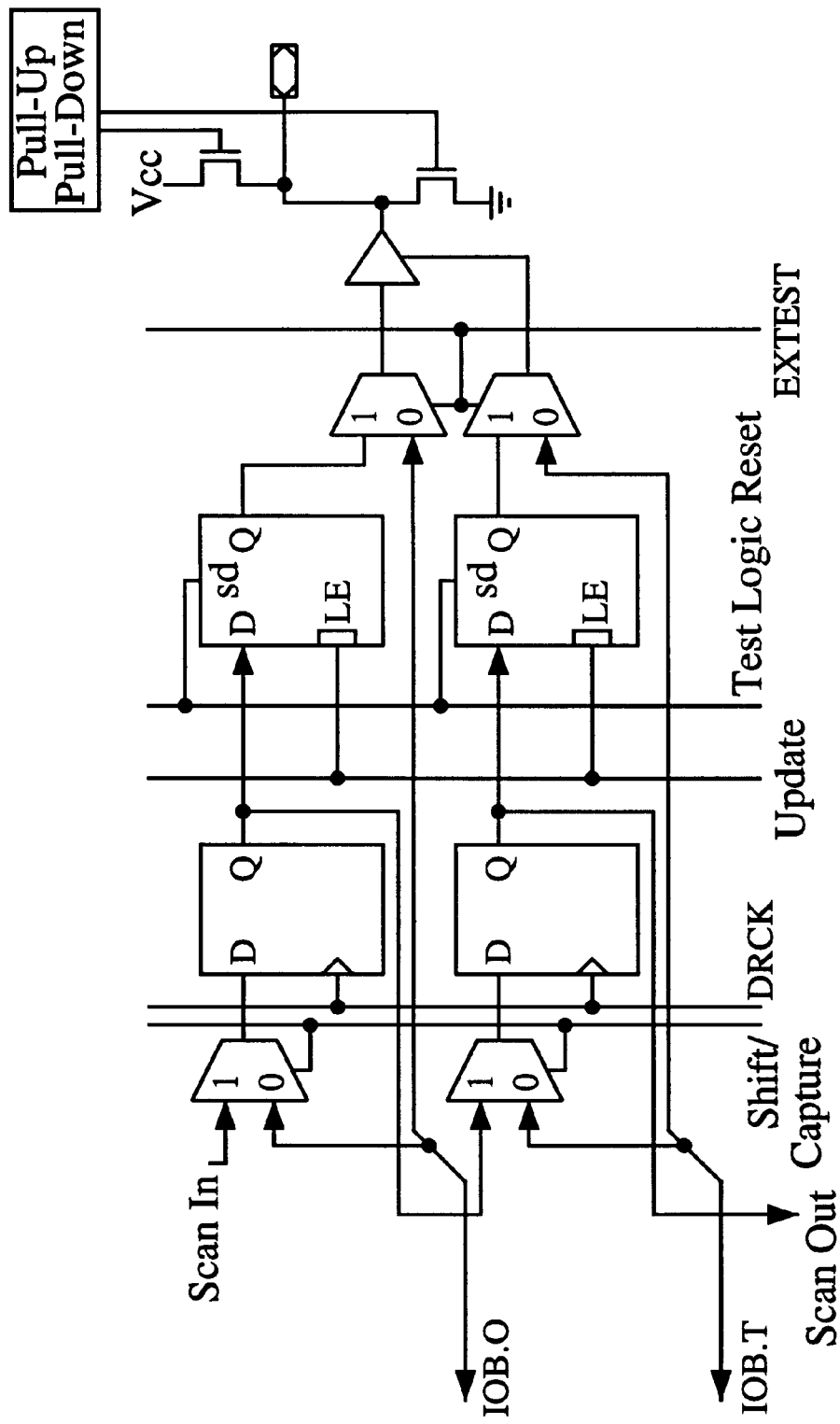
FIG. 3 illustrates a prior art boundary scan circuit for a tri-statable I/O pad.
Figure 4:
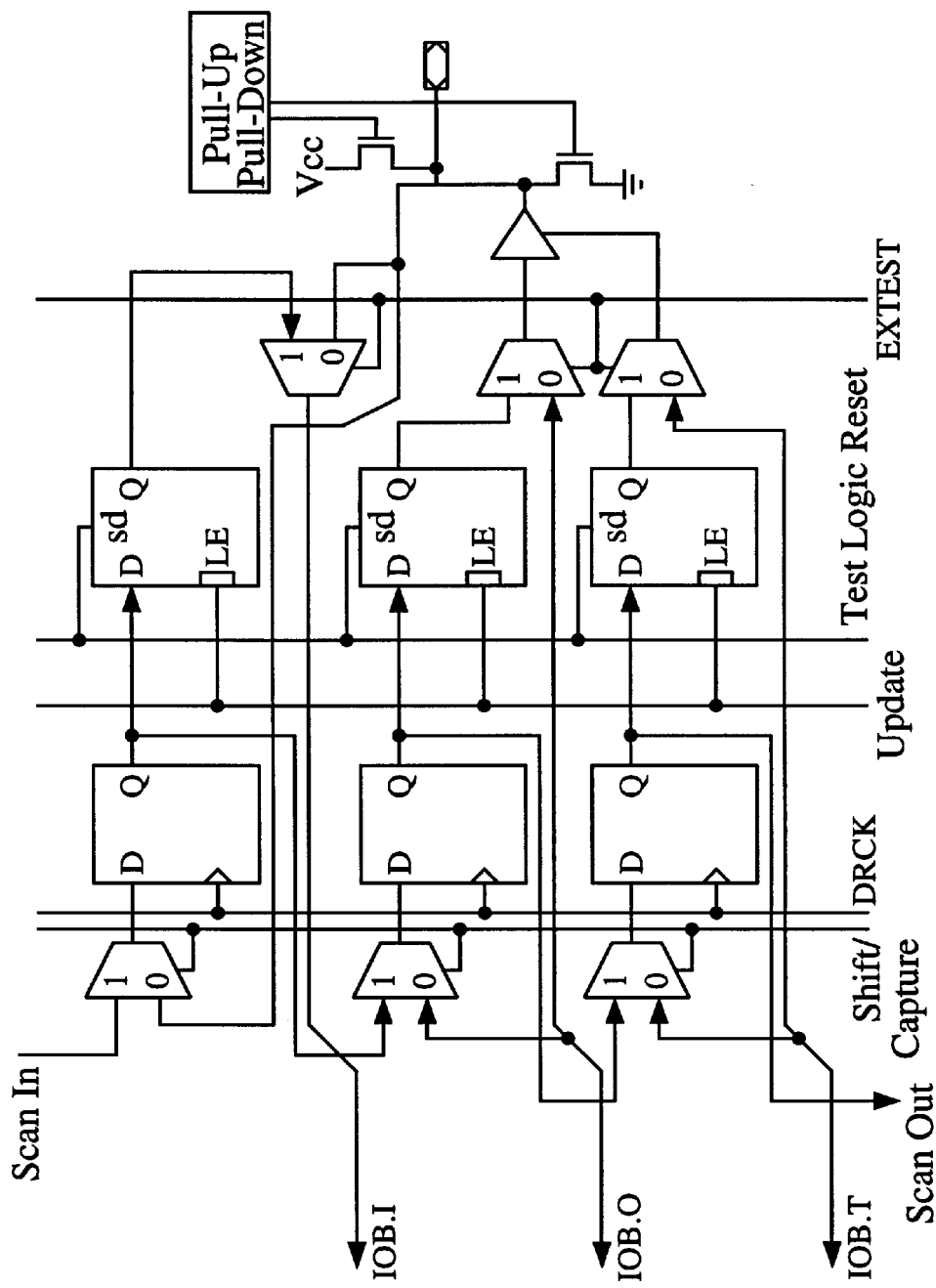
FIG. 4 shows a prior art boundary scan circuit for a bidirectional I/O pad.
Figure 5:
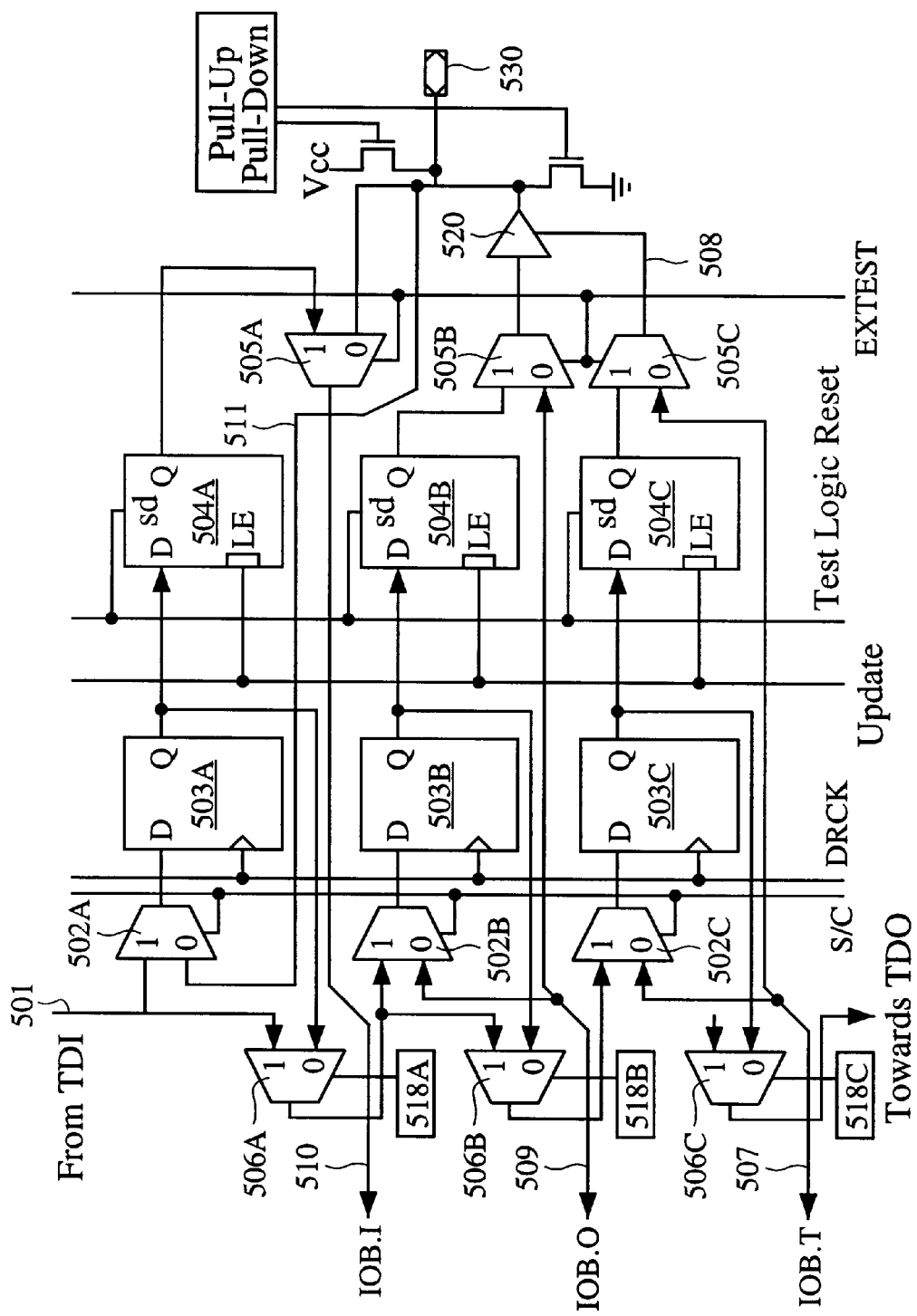
FIG. 5 illustrates an I/O block boundary scan chain circuit with skip multiplexers in accordance with the present invention.

FIG. 5 illustrates a block circuit diagram disclosing a lookahead skip structure in accordance with the present invention for the Xilinx XC4000™ series or XC5200™ family of programmable logic devices. Data-in terminal 501 forwards an input scan signal originating at a test access port (TAP) which is well known in the art and therefore not described in detail herein. In the circuit's operational mode, signal EXTEST is set low. Signal IOB.O, an output signal, moves along signal line 509 through multiplexer 505B to tri-state buffer 520. Tri-state buffer 520 is controlled by signal IOB.T, a tri-state buffer control signal, which is transferred on line 507 through multiplexer 505C, to control tri-state buffer 520 after passing along signal line 508. Similarly, a signal originating at I/O pad 530 passes through multiplexer 505A to generate signal IOB.I, an input signal, on line 510.

To perform a scan test in the circuit of FIG. 5, a high signal is placed on the Shift-Capture line S/C to place the circuit in data-receive mode. A series of test bits are then shifted into shift register flip-flops 503A–503C via line 501 and multiplexers 502A–502C, in concert with the clocking of signal DRCK. Specifically, each of memory bits 518A–518C are set to a low voltage level to enable multiplexers 506A–506C to receive output signals from shift register flip-flops 503A–503C, respectively. Memory bits 518A–518C may comprise any available volatile or non-volatile memory type, including SRAM or EPROM, but are preferably comprised of whatever memory is available on the device with which the inventive structure of the present invention is integrated. Each time signal DRCK clocks, an additional test bit is forwarded into the chain of test bits and the entire chain is forwarded one bit. Multiplexer 506C forwards the chain to the next I/O block.

Next, signal Update is toggled from low to high and then back to low, thereby causing flip-flop latches 504A–504C to store signals received from their respective shift register flip-flops 503A–503C. Then signal EXTEST is raised high, thereby forwarding the desired test bits to their intended test destinations.

Note that the signal originating at pad 530, as well as signals IOB.O and IOB.T may be forwarded through multiplexers 502A–502C along signal lines 511, 509, and 507 to their respective flip-flops when the signal on line S/C is low, thereby enabling full access to signals processed through the I/O block.

However, if the user desires to not utilize one or more of the three available signal paths shown in FIG. 5, the user may bypass that path by programming the corresponding memory bit, memory bit 518A for instance, with a logic one signal. In this manner, the scan test bit arriving on line 501 is forwarded directly to multiplexers 502B and 506B without incurring the delay of clocking through flip-flop 503A.

Figure 5A:
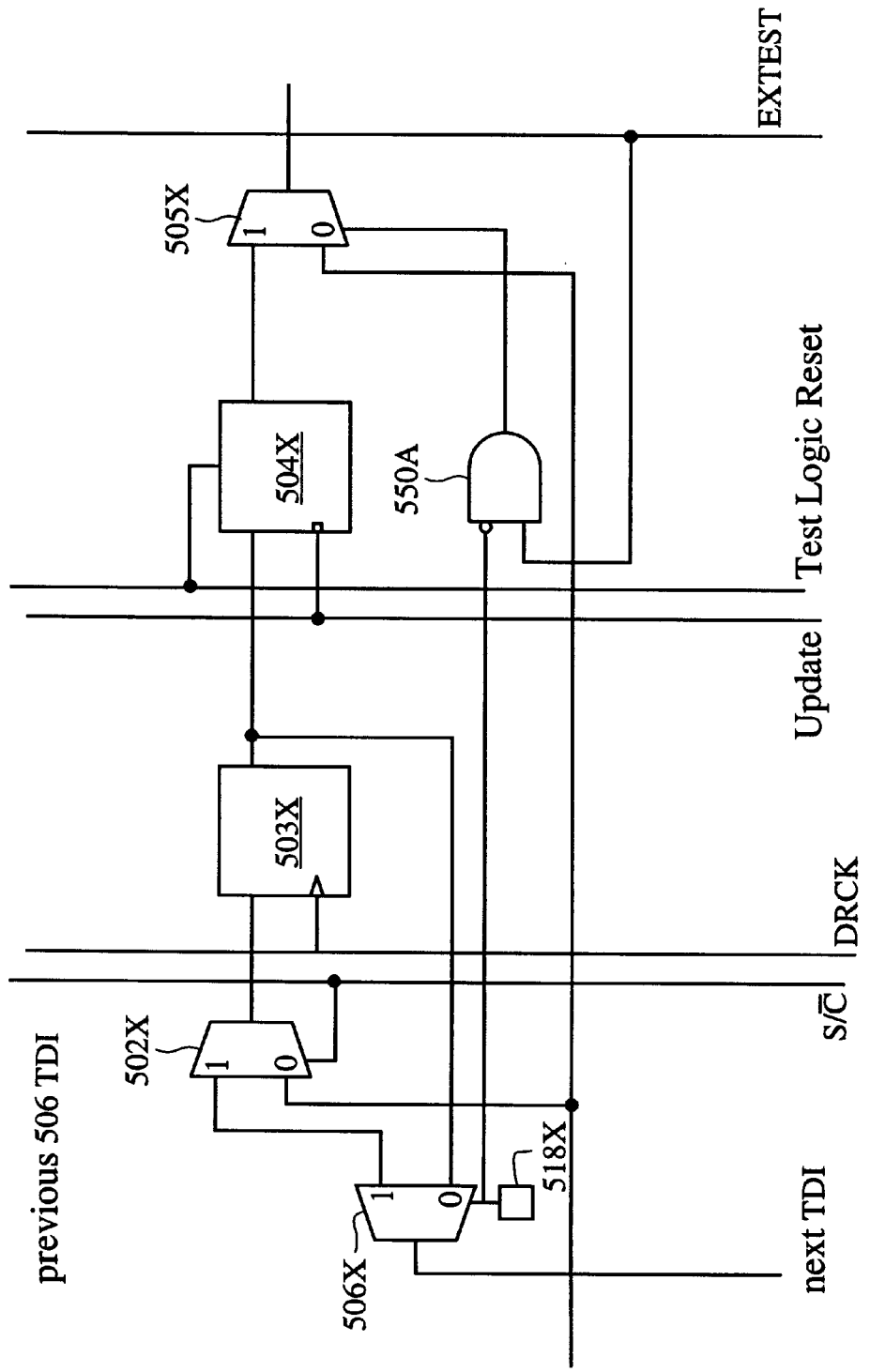
FIG. 5A shows an I/O block boundary scan chain circuit having a gate in the path of the skip multiplexer to maintain the original multiplexer selection of the skipped section.
Figure 5B:
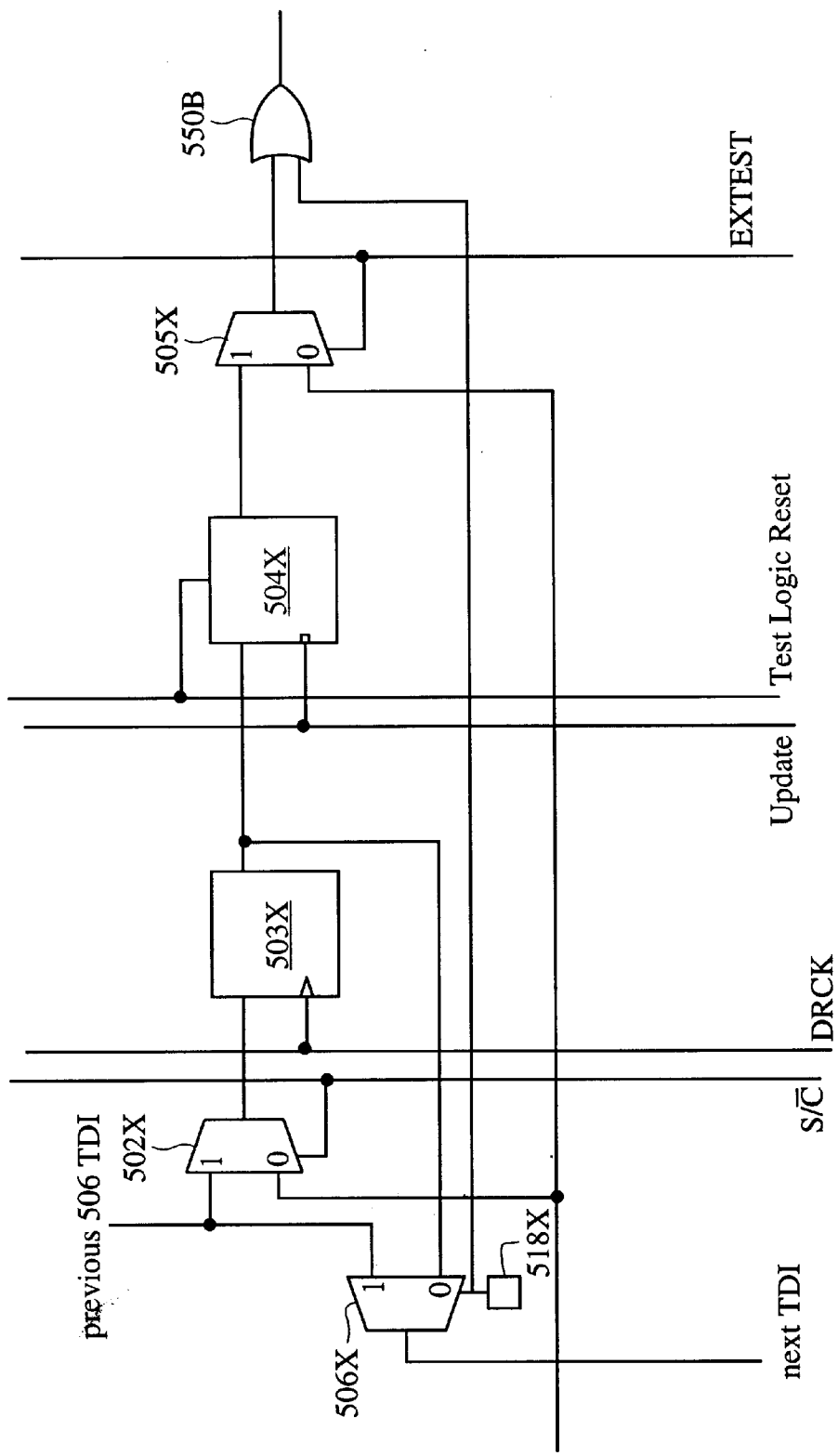
FIG. 5B shows an I/O block boundary scan chain circuit having a gate in the output of the skip multiplexer to force a constant value on the output of the signal driven by the original multiplexer of the skipped section.

Note that any skipped flip-flop, from flip-flops 503A–503C in FIG. 5, takes its input bits from the scan chain, even though the skipped bits do not get shifted into the same chain. Therefore, it is sometimes desirable to provide control for the logic controlled by the skipped bits. In accordance with one embodiment, the logic value of memory bits 518A–518C controlling the skip function can be used to produce a desired result in the skipped function. Specifically, as shown in FIG. 5A, a gate 550A in the path of the multiplexer select can maintain the original multiplexer selection of the skipped segments. A gate 550B, as shown in FIG. 5B, in the output path of the multiplexer can establish an alternate constant result.

Thus, one example of a boundary scan lookahead structure shown in FIG. 5 provides the ability to bypass any number of paths within an I/O block. For instance, if the user desires to skip all three paths of a single logic block, all three memory bits may be set high. In the above-described embodiment of the present invention, when one or two of the three flip-flops are not needed, a multiplexer is used to skip around the unused flip-flop(s). However, the user may desire to eliminate the small delay (3 levels of logic or 3 pass transistors) created by the bypass multiplexers and skip the I/O block entirely. Moreover, if it is desired to skip all three flip-flops in several adjacent I/O blocks, considerable delay can be incurred by having the signal propagate through the bypass multiplexers.

Figure 6:
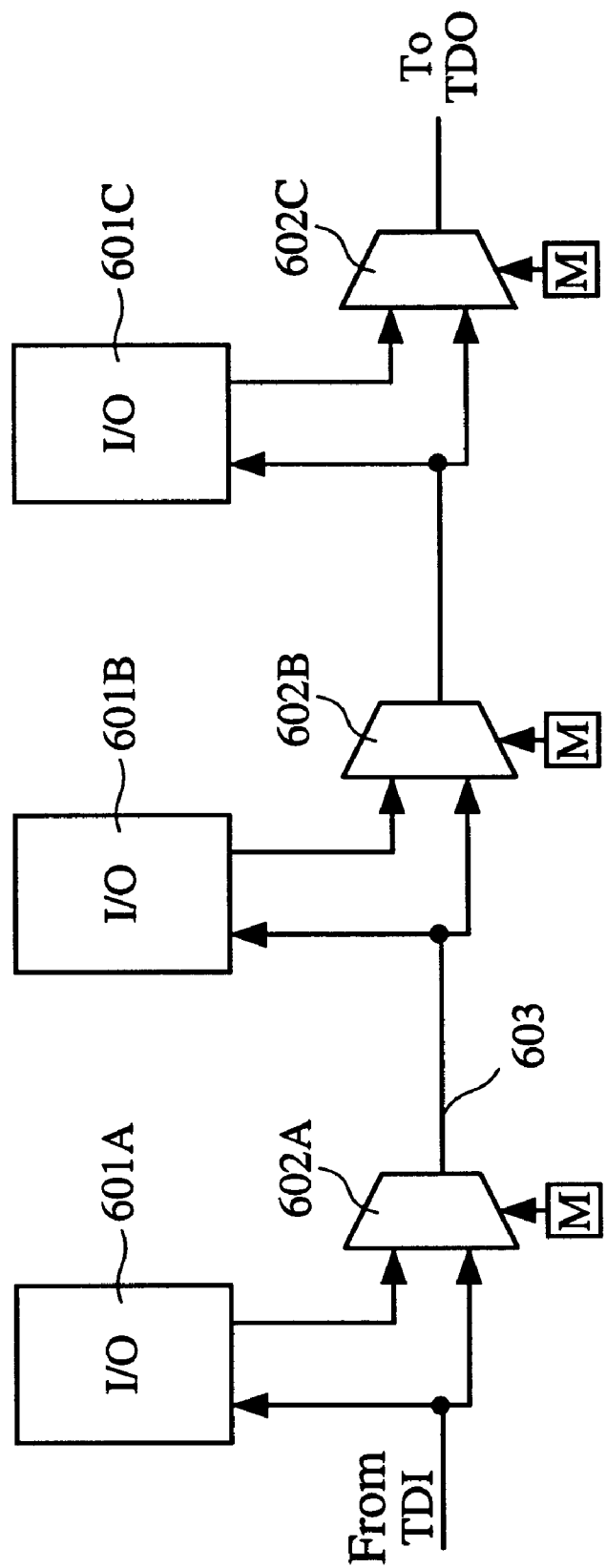
FIG. 6 is a simplified illustration of boundary scan skip multiplexer implementation in accordance with the present invention.

To that end, the circuit of FIG. 6 may be incorporated into the PLD as well. In this figure, bypass multiplexers 602A–602C allow selective bypassing of I/O blocks 601A–601C. For example, bypass multiplexer 602B can be set to bypass I/O block 601B completely and pass the test signal from line 603 to adjacent I/O block 601C, thereby eliminating any delay associated with I/O block 601B.

Figure 7:
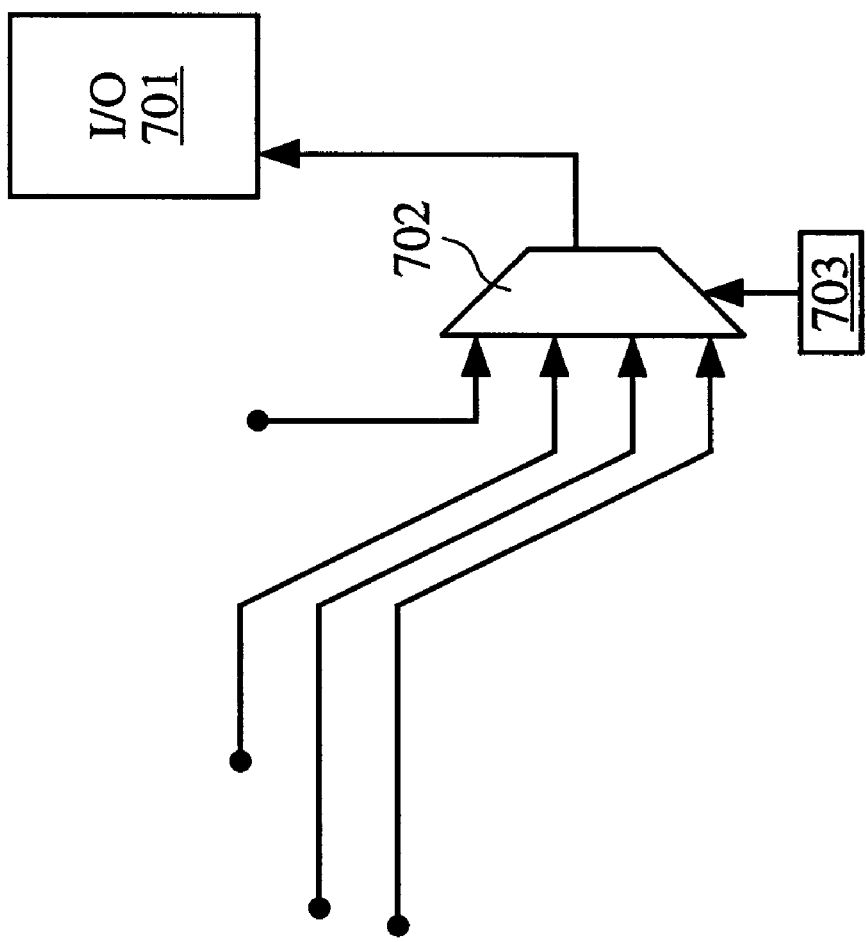
FIG. 7 is a simplified diagram illustrating a version of the present invention for skipping one or more adjacent I/O block flip-flops.
Figure 8:
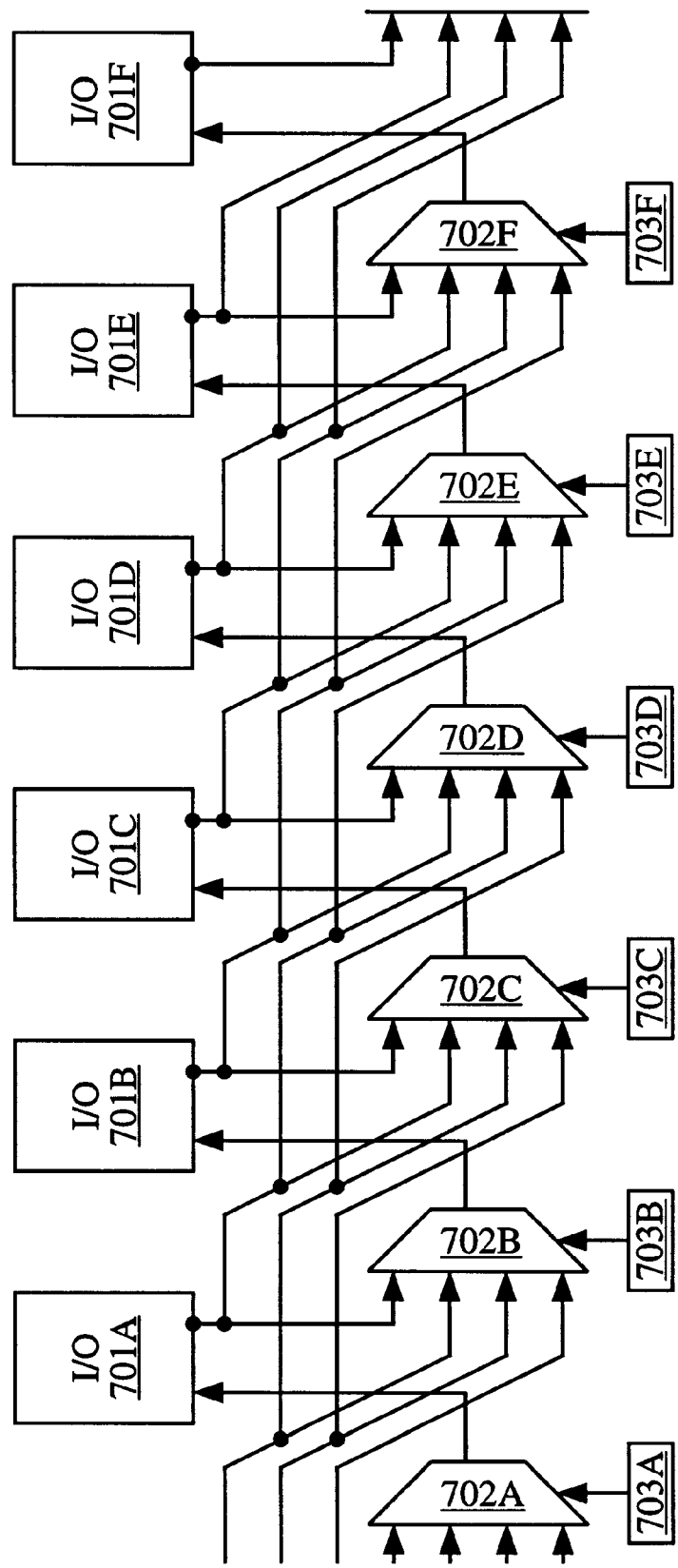
FIG. 8 is a simplified diagram illustrating a bypass chain multiplexer linear array in accordance with the invention.
Figure 9:
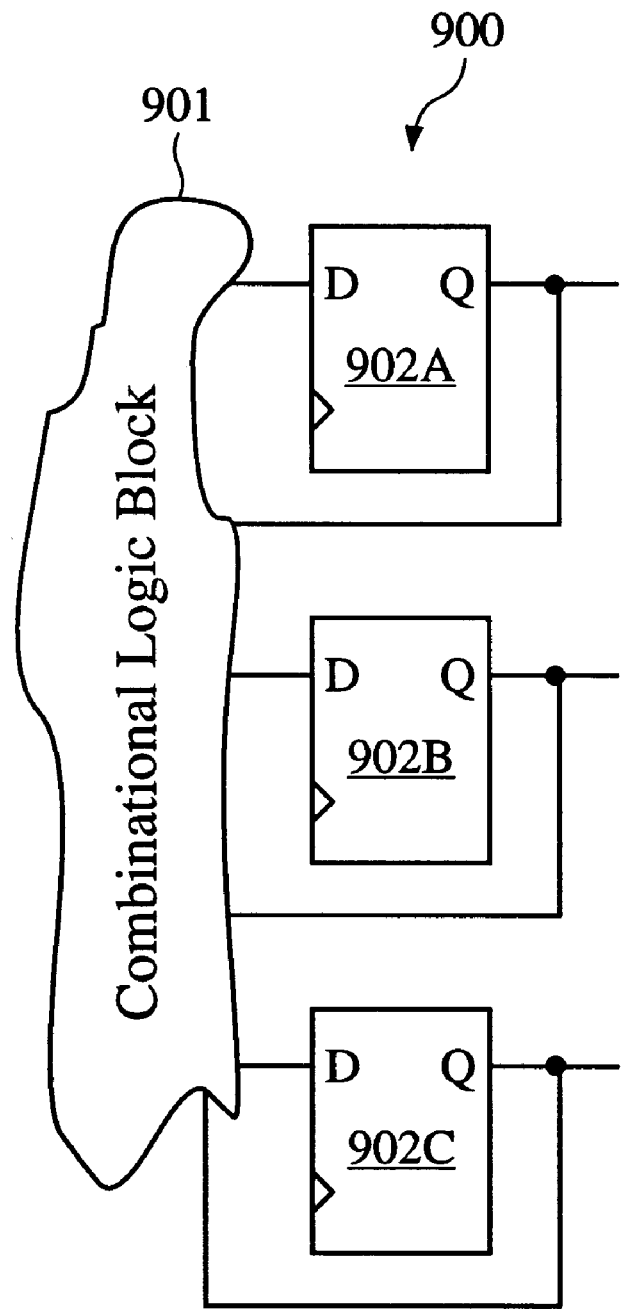
FIGS. 9 and 10 illustrate a portion of an FPGA before and after inserting LSSD circuitry, respectively.
Figure 10:
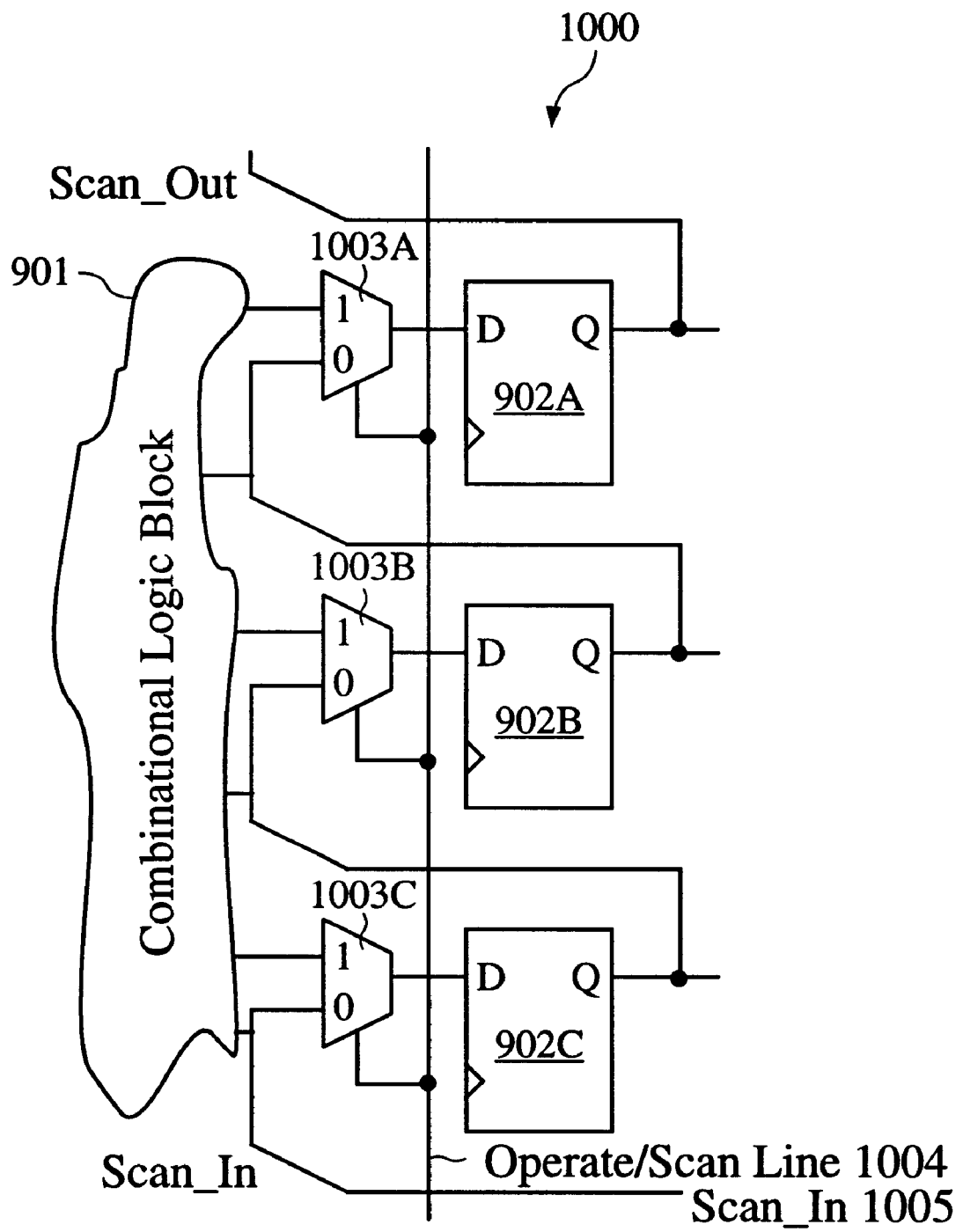

FIG. 7 illustrates an I/O bypass multiplexer 702 having a 2-bit memory 703 coupled to provide a scan signal to I/O block 701. As shown in FIG. 8, this structure can be replicated so that the scan input to I/O block 701F, for example, can be selected from one of I/O blocks 701B–701E. Thus, multiplexers 702A–702F facilitate bypassing a plurality of I/O blocks while providing optimal flexibility in the scan bits used in the scan chain. Note that multiplexers 702A–702F in this embodiment provide four input terminals, whereas other embodiments may provide a different number of inputs (thereby necessitating sufficient bits in memories 703A–703F to control the additional inputs). Thus, for a multiplexer 702 with n inputs, n–1 I/O blocks 701 can be skipped. If desired, this structure can be expanded to become even more efficient until the desired level of bypass structure granularity and speed is achieved.

Figure 11:
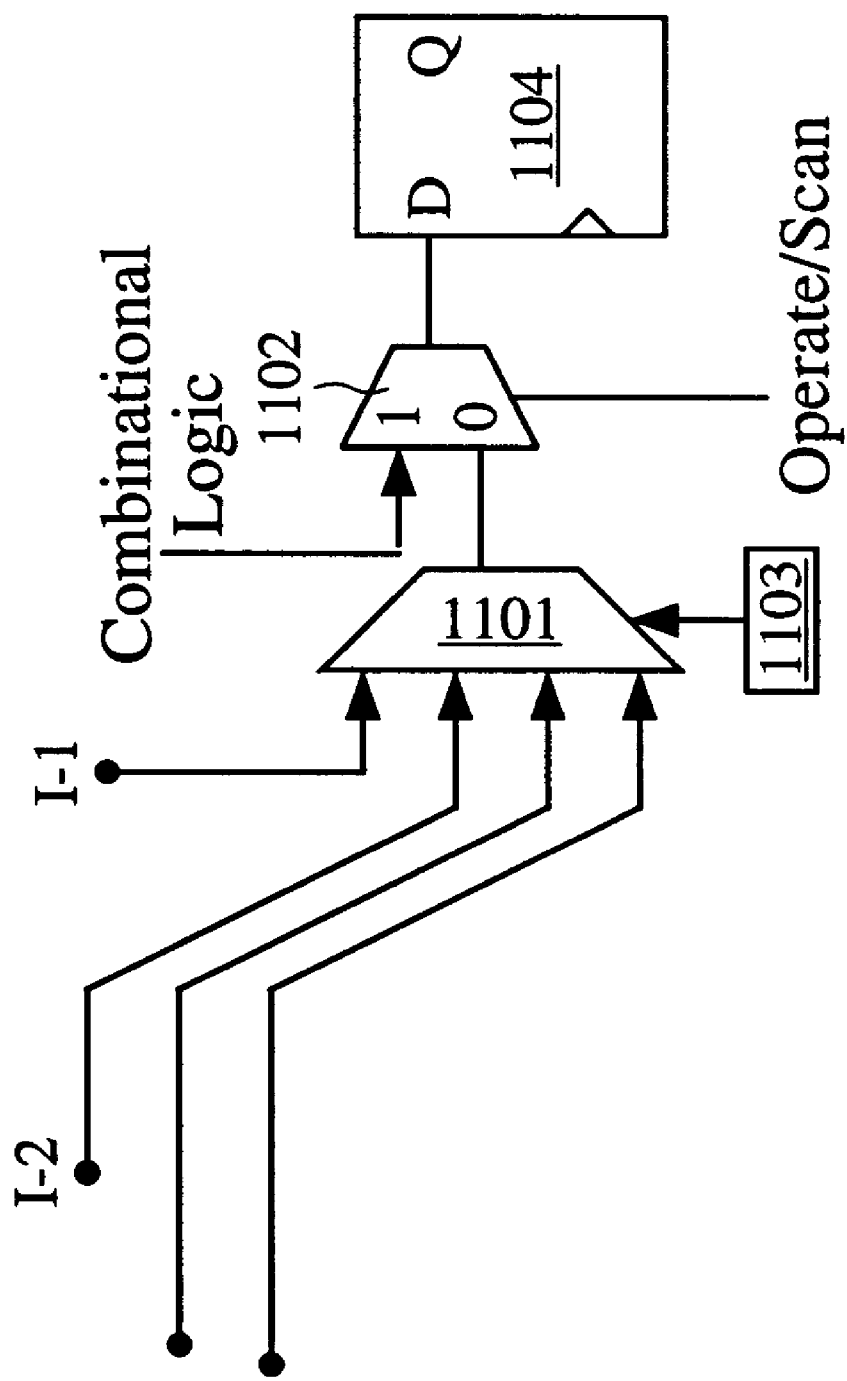
FIG. 11 illustrates the implementation of the inventive bypass scan multiplexer operation in an LSSD circuit.

Bypass multiplexers can also be applied to LSSD circuitry as shown in FIG. 11. Specifically, a bypass multiplexer 1101 having a plurality of input lines, is inserted in front of each scan multiplexer 1102. The input line I-1 to bypass multiplexer 1101 is connected to the output line of an adjacent flip-flop (not shown), whereas the input line I-2 is connected to the output line of the flip-flop (also not shown) that is two-flip-flops away, and so on. Bypass multiplexer 1101 is controlled by a configuration memory cell 1103.

Figure 12:
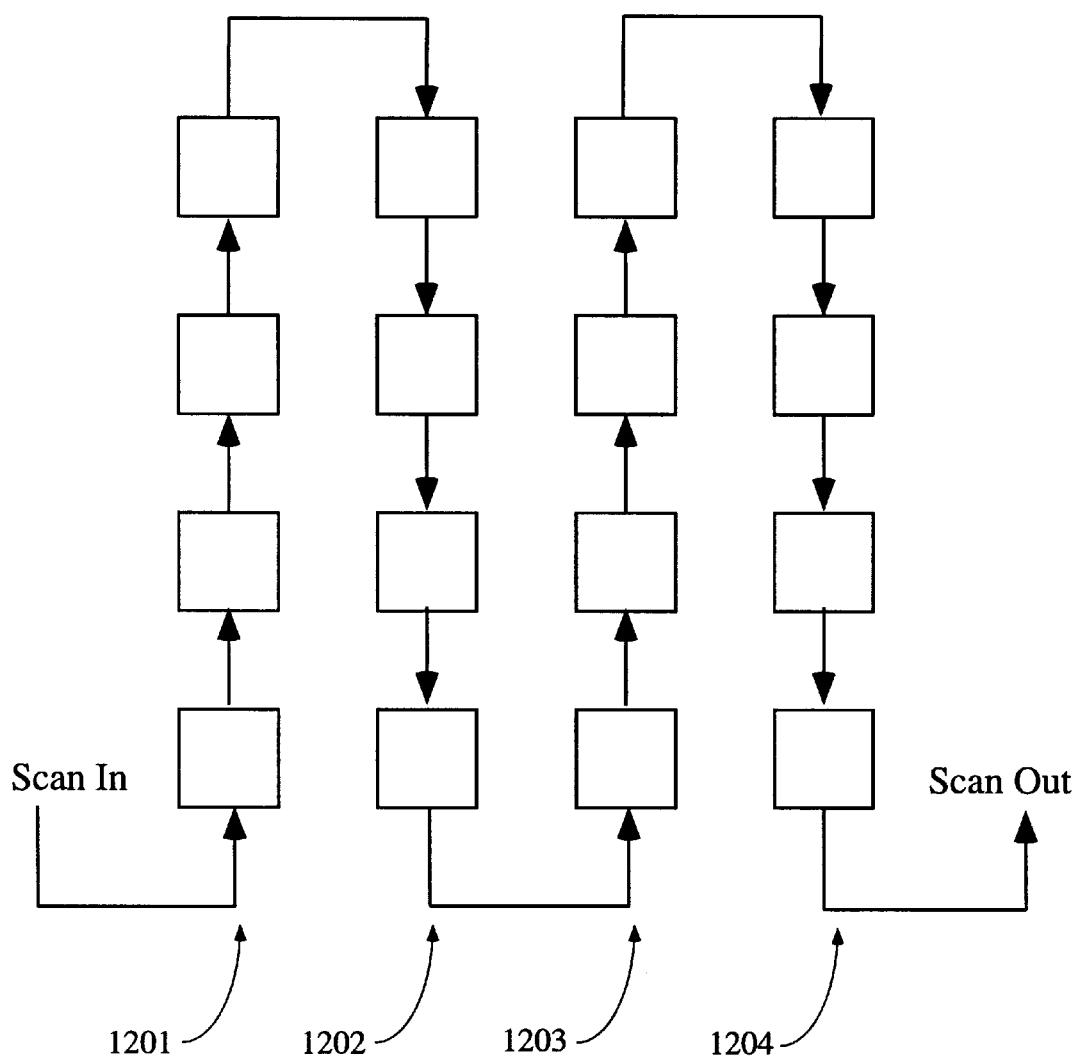
FIG. 12 shows a vertically-oriented scan chain.
Figure 13:
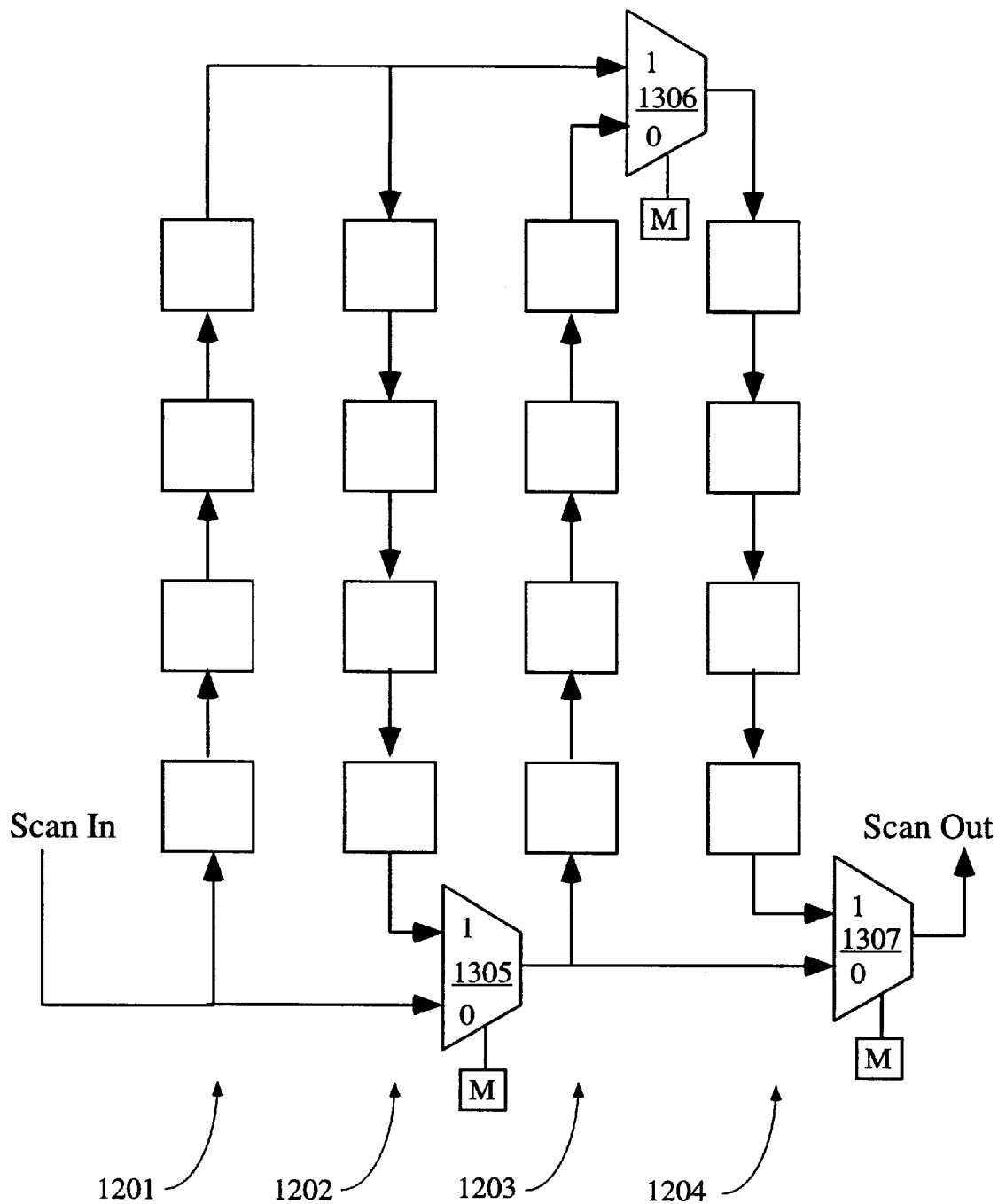
FIG. 13 illustrates a vertically-oriented scan chain with multiplexers placed adjacent the top and bottom of predetermined columns in accordance with the present invention.

FIG. 12 shows a vertically-oriented scan chain which shifts up a first column 1201, down a second column 1202, up a third column 1203, and down a fourth column 1204, as indicated with arrows. Note that each column includes a plurality of cells, wherein each cell may comprise one or more bypass multiplexers 1101 controlled by a memory 1103, a scan multiplexer 1102, and a flip-flop 1104 (see FIG. 11). In accordance with one embodiment of the present invention, if all of the scan chain bits are unused in two adjacent columns of a programmable device, those scan bits may be selectively removed from the scan chain by using multiplexers at the top and/or bottom of vertically-oriented scan chains. For example, FIG. 13 shows multiplexers placed adjacent the top and bottom of predetermined columns. Specifically, the input signal to third column 1202 of the scan chain is typically the output signal of second column 1202. However, in this embodiment, multiplexer 1305 allows the signal to first column 1201 and the signal from second column 1202 to be switched in or out of the scan chain. Thus, if multiplexer 1305 selects the input signal on terminal 1, first column 1201 and second column 1202 are included in the scan chain. However, if multiplexer 1305 selects the input on terminal 0, then first column 1201 and second column 1202 are excluded from the scan chain. Similarly, multiplexer 1306 is used to include or exclude second column 1202 and third column 1203 from the scan chain, and multiplexer 1307 is used to include or exclude third column 1203 and fourth column 1204 from the scan chain.

Figure 14:
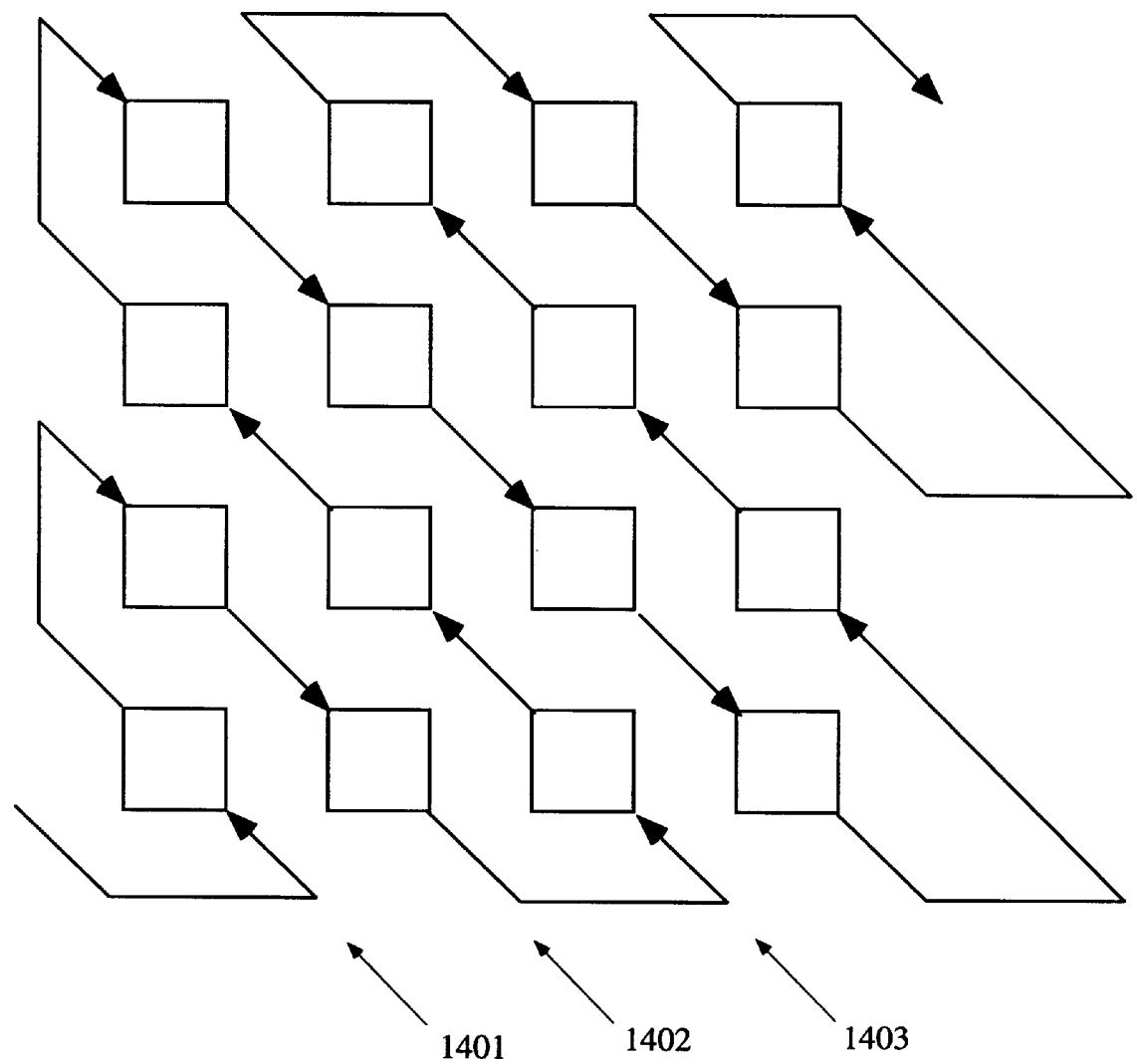
FIG. 14 shows a scan chain which runs diagonally.

A scan chain which runs diagonally, as shown in FIG. 14, may have a different number of cells in the "columns". For example, there are three cells in column 1403, two cells in column 1402, and only one cell in column 1401.

Figure 15:
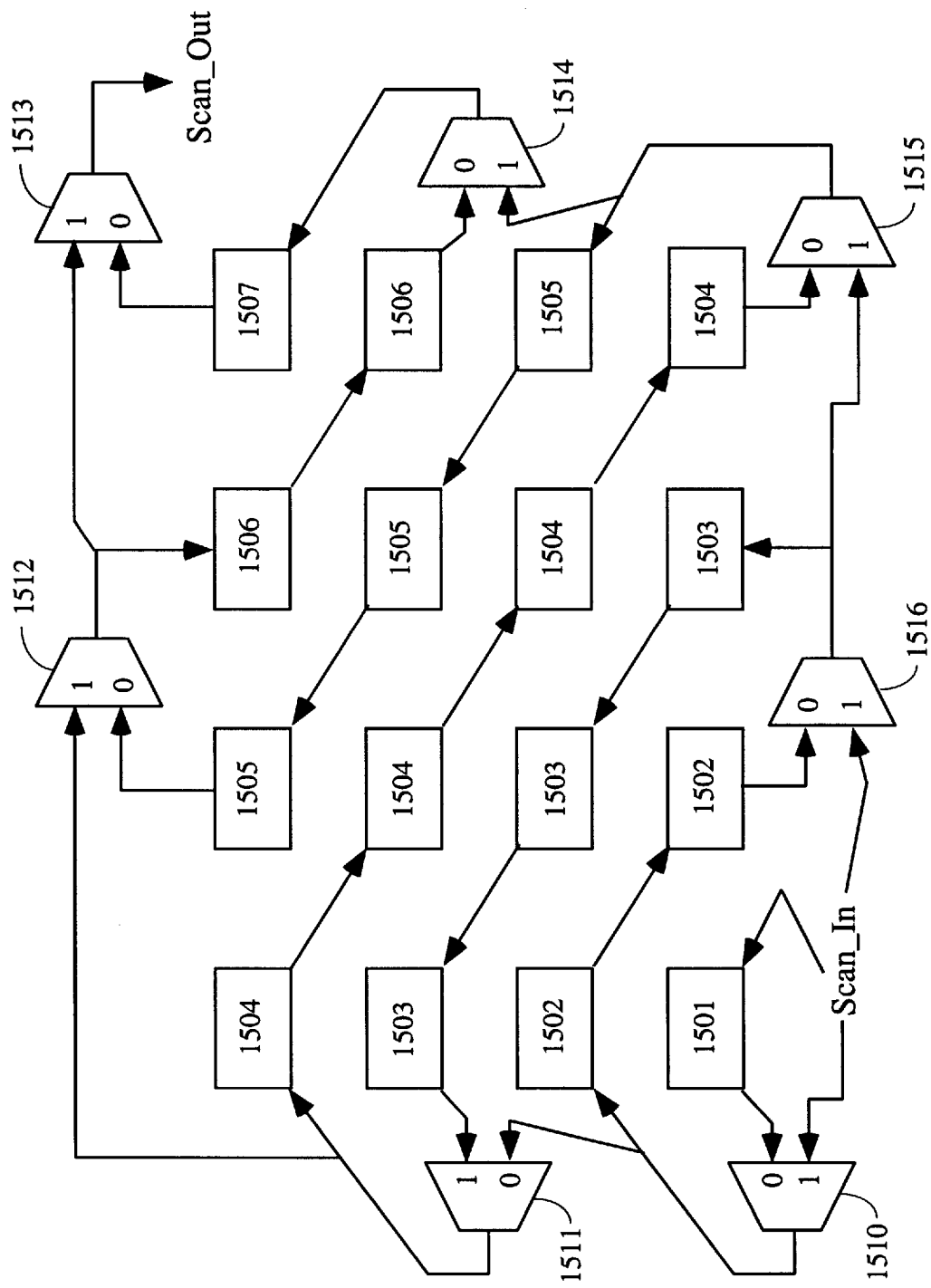
FIG. 15 illustrates a diagonal scan chain with multiplexers placed adjacent the ends of predetermined columns in accordance with the present invention.

In accordance with the present invention, multiplexers are placed adjacent the ends of predetermined diagonal columns as shown in FIG. 15. Specifically, the lines that connected the output line of one column to the input line of the adjacent column in FIG. 14 have been replaced with multiplexers that facilitate the optional skipping of adjacent columns. For example, multiplexer 1510 selects the input signal to the scan chain in column 1502 to be either the output signal of the scan chain in column 1501 or the input signal to the scan chain, Scan_In. Multiplexer 1511 selects the input signal to the scan chain in column 1504 to be either the output signal of column 1503 or the output signal of multiplexer 1510. Multiplexer 1512 selects the input signal to the scan chain in column 1506 to be either the output signal of column 1505 or the output signal of multiplexer 1511. Multiplexer 1513 selects the output signal to the scan chain, Scan_Out, to be either the output signal of column 1507 or the output signal of multiplexer 1512. Multiplexer 1514 selects the input signal to the scan chain in column 1507 to be either the output signal of column 1506 or the output signal of multiplexer 1515. Multiplexer 1515 selects the input signal to the scan chain in column 1505 to be either the output signal of column 1504 or the output signal of multiplexer 1516. Finally, multiplexer 1516 selects the input signal to the scan chain in column 1503 to be either the output signal of the scan chain in column 1502 or the input to the scan chain, Scan_In. In this configuration, any pair of adjacent columns may be included or excluded from the scan chain.

In practice, it is unlikely that the longest columns, i.e. columns 1503, 1504, and 1505, in this example, would be unneeded. Therefore, in one embodiment of the present invention (not shown), multiplexers 1512 and 1515 could be replaced with lines, as are shown in FIG. 14.

While the present invention has been described with reference to certain preferred embodiments, those skilled in the art will recognize that various modifications and other embodiments may be provided. For example, although gates are used to maintain the integrity of the logic controlled by the bits that are skipped in the scan chain, these gates (or other means to provide the same function) can be used when skipping blocks or columns. These modifications and embodiments are intended to fall within the scope of the present invention, which is limited only by the following claims.

We claim:

1. In an integrated circuit, a programmable skip structure for use with boundary scan circuitry for testing an I/O block, the boundary scan circuitry including a plurality of sequential storage devices and a plurality of selecting devices for providing signals to the plurality of storage devices, a first selecting device receiving an input scan signal, the programmable skip structure comprising:

a chain of multiplexers, wherein a first multiplexer in the chain receives the input scan signal and an output signal from a first storage device, and provides an output signal to a next selecting device and a next multiplexer in the chain, and wherein the next multiplexer in the chain receives an input signal from a next storage device.

2. The programmable skip structure of claim 1 further including means for maintaining the integrity of the logic controlled by a signal skipped in the scan chain.

3. In an integrated circuit, a programmable skip structure for use with boundary scan circuitry for testing a plurality of I/O blocks in a scan chain, the structure comprising:

a chain of multiplexers, wherein a first multiplexer in the chain receives an input scan signal and an output signal from a first I/O block, a next multiplexer in the chain receives an output signal from the first multiplexer and an output signal from a next I/O block, and the next I/O block receives an output signal from the first multiplexer.

4. The structure of claim 3 further including means for maintaining the integrity of the logic controlled by the signals associated with an I/O block skipped in the scan chain.

5. In an integrated circuit, a programmable skip structure for use with boundary scan circuitry for testing a plurality of I/O blocks, the structure comprising:

a multiplexer including a programmable selector, wherein an output terminal of the multiplexer is connected to an input terminal of a single I/O block, and wherein input terminals to the multiplexer are connected to a plurality of I/O block output terminals.

6. The structure of claim 5 wherein the multiplexer comprises n input terminals for programmably skipping up to n−1 I/O blocks.

7. The structure of claim 5 further including means for maintaining the integrity of the logic controlled by the signals associated with a skipped I/O block.

8. In an integrated circuit, a programmable skip structure for use with an LSSD circuit, the LSSD circuit including a scan multiplexer for receiving a signal from combinational logic and providing an output signal to a single flip-flop, the programmable skip structure comprising:

a bypass multiplexer including a programmable selector, wherein an output terminal of the bypass multiplexer is connected to an input terminal of the scan multiplexer, and wherein input terminals to the bypass multiplexer are connected to a plurality of flip-flop output terminals.

9. The programmable skip structure of claim 8 wherein the input terminals of the bypass multiplexer comprise a plurality of n input terminals for programmably skipping up to n−1 flip-flops.

10. The structure of claim 8 further including means for maintaining the integrity of the logic controlled by a bit associated with a skipped flip-flop.

11. In anVIEW integrated circuit, a programmable skip structure for use with LSSD testing of columns of a scan chain, the structure comprising:

a multiplexer including a programmable selector, wherein one input terminal of the multiplexer is connected to an output line of a second column and another input terminal of the multiplexer is connected to an input line of the scan chain, and wherein an output terminal of the multiplexer is connected to one of an input line of a third column and an output line of the scan chain.

12. The structure of claim 11 wherein the columns are vertically-oriented.

13. The structure of claim 11 wherein the columns are horizontally-oriented.

14. The structure of claim 11 wherein the columns are diagonally-oriented.

15. The structure of claim 11 wherein the columns include different numbers of cells.

16. The structure of claim 11 further including means for maintaining the integrity of the logic controlled by bits associated with a skipped column in the scan chain.

17. A programmable skip structure according to claim 1, wherein each multiplexer can be individually controlled to be on and pass through one of two input signals supplied thereto directly to an output of the multiplexer, thereby bypassing a storage device during a scan, or be off and not bypass the storage device during a scan.

18. A programmable skip structure according to claim 1, wherein the first multiplexer can be controlled to be on and pass through the scan input signal supplied thereto directly to the next selecting device, thereby bypassing a first storage device during a scan, or be off and not bypass the first storage device during a scan.

19. The programmable skip structure of claim 18 further including a plurality of programmable memory bits, each memory bit by its state controlling a separate skip multiplexer to be either on or off corresponding to the state of the memory bit.

20. In an integrated circuit, a programmable skip structure for use with boundary scan circuitry for testing an I/O block, the boundary scan circuitry including a plurality of sequentially scanned storage devices, each storage device being provided with a separate selecting device for providing signals to each storage device, a first selecting device receiving an input scan signal, the programmable skip structure comprising:

the first selecting device having an output supplied as an input to a first storage device;

a second selecting device whose output is supplied as an input to a second storage device;

a third selecting device whose output is supplied as an input to a third storage device;

a series connection of a plurality of skip multiplexers, wherein a first skip multiplexer in the series connection receives as inputs the input scan signal and an output signal from the first storage device and provides an output signal to the second selecting device and a second multiplexer in the series connection;

the second multiplexer in the series connection receives as another input signal an output signal from the second storage device and provides an output signal to the third selecting device and a third multiplexer in the series connection; and wherein the first skip multiplexer and the second skip multiplexer can be individually controlled to be on and pass input signals supplied thereto directly to the output of the first skip multiplexer and the output of the second skip multiplexer, respectively, thereby bypassing the first storage device and the second storage device, respectively, during a scan, or be off and not bypass the first storage device and the second storage device, respectively, during a scan.

21. The programmable skip structure of claim 20 further including a plurality of programmable memory bits, each memory bit by its state controlling a separate skip multiplexer to be either on or off corresponding to the state of the memory bit.

* * * * *

UNITED STATES PATENT AND TRADEMARK OFFICE
CERTIFICATE OF CORRECTION

PATENT NO. : 5,909,453

DATED : June 1, 1999

INVENTOR(S) : Steven H. Kelem, et al.

It is certified that error appears in the above-identified patent and that said Letters Patent is hereby corrected as shown below:

Column 8, line 55, after "an" delete "VIEW".

Signed and Sealed this

Second Day of November, 1999

Attest:

Q. TODD DICKINSON

Attesting Officer

Acting Commissioner of Patents and Trademarks